US 6,687,529 B2

(12) United States Patent
Van Vaals

(10) Patent No.: US 6,687,529 B2
(45) Date of Patent: Feb. 3, 2004

(54) METHOD OF ACQUIRING IMAGES OF A PLANE IN A MAGNETIC RESONANCE APPARATUS AND MAGNETIC RESONANCE APPARATUS SUITABLE FOR CARRYING OUT SUCH A METHOD

(75) Inventor: Johannes Jacobus Van Vaals, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/942,013

(22) Filed: Aug. 29, 2001

(65) Prior Publication Data

US 2002/0065458 A1 May 30, 2002

(30) Foreign Application Priority Data

Aug. 30, 2000 (EP) .............................. 00203019

(51) Int. Cl.[7] .............................. A61B 5/055
(52) U.S. Cl. ............... 600/417; 600/407; 600/410; 600/425; 600/429
(58) Field of Search ................. 600/414, 407, 600/426, 429, 417; 606/130; 324/309

(56) References Cited

U.S. PATENT DOCUMENTS

| 5,307,808 A | * | 5/1994 | Dumoulin et al. .......... 600/420 |
| 5,545,993 A | | 8/1996 | Taguchi et al. ............. 324/309 |
| 5,787,886 A | * | 8/1998 | Kelly et al. ................. 600/407 |
| 5,891,158 A | * | 4/1999 | Manwaring et al. ........ 600/102 |
| 6,006,126 A | | 12/1999 | Cosman ...................... 600/426 |

FOREIGN PATENT DOCUMENTS

| WO | WO9855018 | 11/1998 | ............ A61B/5/00 |
| WO | WO9851229 | 12/1998 | ........... A61B/19/00 |

OTHER PUBLICATIONS

J.A. Derbyshire et al., "Dynamic Scan Plane Tracking using MR Position Monitoring," Sydney, Australia, Apr. 18–24, 1998, p. 2136.
H. Eviatar et al., "Motion Compensation by Gradient Adjustment," Vancouver, B.C., Canada, Apr. 12–18, 1997 p. 1898.
J. A. Derbyshire et al., "Dynamic Scan Plane Tracking MR Position Monitoring," Sydney, Australia, Apr. 18–24, 1998, p. 2136.
H. Eviatar et al., "Motion Compensation by Gradient Adjustment," Vancouver, B.C., Canada, Apr. 12–18, 1997 p. 1898.
"Interactive MR–guided Biopsy in an Open–Configuration MR Imaging System" by Stuart G. Silverman, MD, et al., in Radiology, vol. 197, No. 1, Oct., 1995, pp. 176–181.

* cited by examiner

*Primary Examiner*—Dennis Ruhl
*Assistant Examiner*—Barry Pass
(74) *Attorney, Agent, or Firm*—John Vodopia

(57) ABSTRACT

In a method for acquiring an image of a plane in a magnetic resonance apparatus, the images are obtained in imaging planes which are defined directly with respect to the patient. The magnetic resonance apparatus includes an imaging volume, a patient support table which positioned in the imaging volume, a position measuring device to establish and maintain in real time the position of the patient, as well as a controller for controlling gradient coils in response to the signals provided by the position measuring device in such a manner that consecutive images are acquired from imaging planes which are defined directly with respect to the patient.

10 Claims, 1 Drawing Sheet

Figure 1:
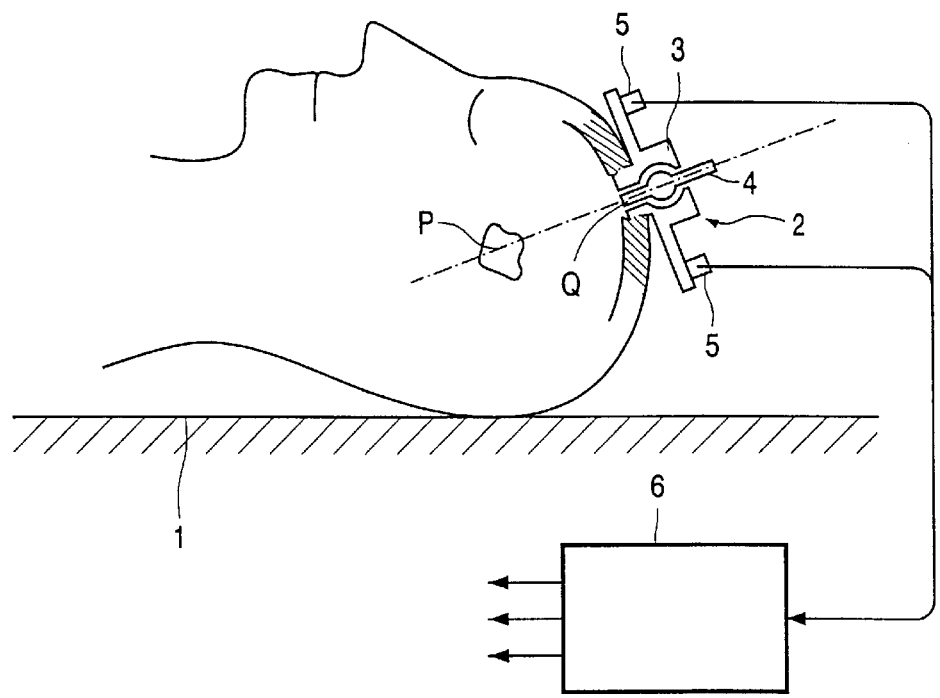

METHOD OF ACQUIRING IMAGES OF A PLANE IN A MAGNETIC RESONANCE APPARATUS AND MAGNETIC RESONANCE APPARATUS SUITABLE FOR CARRYING OUT SUCH A METHOD

The invention relates to a method of acquiring images of a plane in a magnetic resonance apparatus, notably to a method of introducing a medical instrument into the body of a patient in a magnetic resonance apparatus where a position of a tissue to be treated has been determined in three dimensions and also a position of entry for the medical instrument, in which method a path to be followed by the medical instrument is defined by way of at least two different images of body cross-sections through said positions in the magnetic resonance apparatus, said medical instrument being guided along said path so as to reach the tissue to be treated, a plane to be imaged being defined by means of a further image in the magnetic resonance apparatus and the point of intersection of the path to be followed by the medical instrument and said plane to be imaged being indicated in said further image, the medical instrument being maintained at said point of intersection, viewed in the plane to be imaged, during its introduction.

A method of this kind is known from an article by S. G. Silverman c.s., Interactive MR-guided Biopsy in an Open-Configuration MR Imaging System; Radiology, Vol. 197, Oct. 1995, pp. 175–181. According to this known method the acquisition planes are orthogonal to one another, the plane to be imaged extending perpendicularly to the path to be followed by the needle. An optical tracking system which includes position measuring means in the form of LEDs (Light Emitting Diode) that co-operate with cameras, or in the form of one or more coils that are mounted on a medical instrument, for example a needle holder, is provided so as to ensure that the needle can be constantly maintained in the desired direction during its introduction into the relevant part of the body. In other words, the needle is controlled on the basis of the imaging planes that are rigidly defined relative to the magnetic resonance apparatus.

It is very important that the patient, or at least the relevant part of the body, is immobilized during the execution of the described method. For example, in the practice of treatment of tumors in the brain the head is immobilized in the magnetic resonance apparatus with the aid of clamping means. However, this constitutes a substantial burden to the patient. If the head were not immobilized in this example, the tumor could disappear from view in the imaging planes in the case of a change of position, that is, a displacement and/or change of orientation of the head; it would then be necessary to find the tumor again in an iterative manner, that is, by varying the imaging planes continuously until the center of the tumor is once more situated on the line of intersection of two relevant imaging planes. In many cases such treatment will become too long and too risky in those circumstances.

It is an object of the invention to avoid said drawbacks and to provide a method of acquiring images of a plane in a magnetic resonance apparatus which enables fast and accurate treatment without immobilizing the relevant part of the body.

To this end, the method in accordance with the invention is characterized in that the images are acquired in the magnetic resonance apparatus in imaging planes which are defined directly relative to reference points of a patient arranged in the magnetic resonance apparatus. Specific areas of the human anatomy can be used as such reference points, for example characteristic bone structures. It is also possible to fit artificial markers. Consequently, the reference system used is not formed by the magnetic resonance apparatus as is customary according to the present state of the art, but by a co-ordinate system which is linked directly to the patient per se, that is, without the intermediate step involving the co-ordinate system of the magnetic resonance apparatus. Such a method becomes possible notably when a position, that is to say a location and the orientation, of a relevant part of the body, for example the head of a patient, is defined and updated by means of position measuring means on a "real-time" basis, said position enabling the imaging planes to be defined time and again. The images situated in the imaging planes, therefore, are constantly adapted to the changing position and orientation of the relevant part of the body.

The invention relates not only to a method of acquiring images of a plane in a magnetic resonance apparatus, but also to a magnetic resonance apparatus which includes gradient coils. The magnetic resonance apparatus in accordance with the invention is provided with position measuring means for defining and updating a position of a part of the body of a patient on a "real-time" basis, and with control means which, in response to signals from said position measuring means, control the gradient coils in such a manner that images successively acquired in the magnetic resonance image are formed in imaging planes that are defined directly relative to reference points of the patient. A further embodiment of the magnetic resonance apparatus in accordance with the invention is characterized in that the position measuring means are formed by sensors to be attached to a relevant part of the body of a patient. A further embodiment of the invention is characterized in that the magnetic resonance apparatus is arranged to position a needle holder which is associated with a needle guide member, the position measuring means being formed by sensors fitted on the needle holder cum needle guide member which can be attached to the relevant part of the body of the patient so as to be centered relative to the entry position for the needle. With a view to the limited space available in a magnetic resonance apparatus, the sensors are preferably formed by coils for measuring the strength of the magnetic field at the area of the coils and by means for making corrections in a gradient field of the gradient coils associated with the magnetic resonance apparatus, said corrections being based on the variations of the strength of the magnetic field that are caused by changes in position of the coils. Evidently, use can also be made of other positioning means and sensors. The number of coils will be dependent on the number of degrees of freedom granted to the patient. In principle three coils are required for the head; more than three coils may be necessary for other, deformable parts of the body, whereas one coil may already suffice for a patient who is secured on a table that can be freely displaced in the longitudinal direction.

Figure 2:
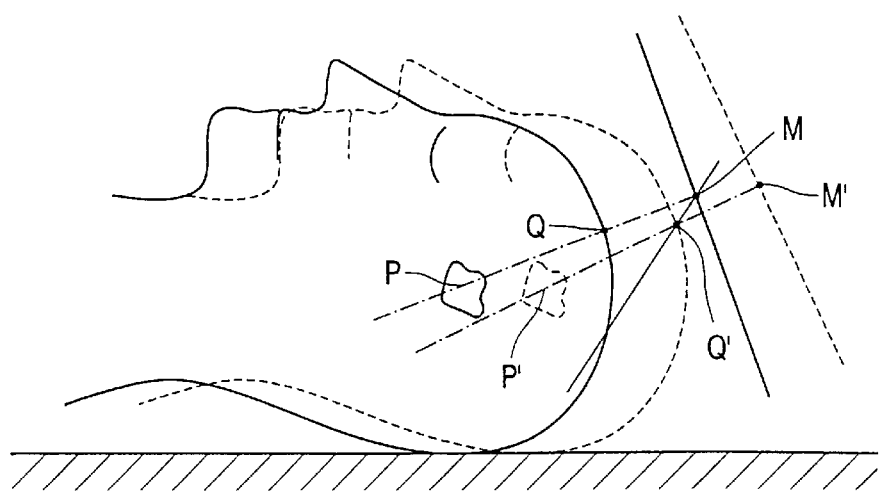

The invention will be described in detail hereinafter, by way of example, with reference to the accompanying drawing. Therein:

FIG. 1 shows a patient to be treated and a needle holder cum needle guide member secured in the skull, and FIG. 2 shows a sketch illustrating the effect of a displacement of the patient.

FIG. 1 shows a patient table 1. The head of a patient arranged thereon is diagrammatically represented. The patient table can be positioned in the usually tunnel-shaped measuring space of a magnetic resonance apparatus that is suitable for medical purposes. A magnetic resonance apparatus of this kind is also referred to as a Magnetic Resonance Imaging (MRI) apparatus and has since long been known, so that it suffices to provide only a superficial description of its operation. Such an apparatus generates a strong, steady, uniform magnetic field in a volume which is intended to be imaged, that is, the imaging volume. Said imaging volume occupies only a small part of said measuring space. Gradient coils provided for this purpose superpose a magnetic gradient field on said uniform field in order to indicate the location of the cross-section of a patient to be imaged in an imaging plane. The atoms in the tissue that is present in the imaging volume are excited by means of an RF field. The spin resonance signal released upon relaxation of the excited atoms is used to reconstruct an image of the cross-section indicated by means of the gradient field.

In the example to be described hereinafter a patient is assumed to have a tumor in the brain which is to be treated by way of ultrasound waves that are to be generated in the tip of a needle normally used for this purpose. It is also assumed that the position P of the tumor in the brain is known; it may have been determined in advance, for example by means of an X-ray apparatus. Furthermore, the position of the point of entry, being the entry position Q, for the needle into the skull, to be determined by an attending surgeon, is also assumed to be known. A needle holder cum needle guide member 2 is arranged at the area of the entry position Q. The needle holder cum needle guide member 2 includes a housing 3 which is secured in the skull, for example by way of screws, and also a needle guide section 4. A ball joint enables rotation of the needle guide section 4 to some extent in all directions relative to the housing 3. This offers some degree of maneuverability for the needle to be guided to the tumor in the brain by the needle guide section 4, that is, for as long as the needle has not yet passed the skull.

When it is assumed for the time being that the head of the patient is immobilized in the measuring space of the magnetic resonance apparatus, the positions P and Q in this apparatus are known and images of the brain can be acquired in two imaging planes through P and Q, one imaging plane being formed, for example by the plane of drawing whereas the other imaging plane extends perpendicularly thereto. When these images are displayed on a monitor, the path to be followed by the needle to be introduced can also be seen. In a defined third plane, which extends, for example, perpendicularly to said other planes, the point of intersection of the path and this plane can be determined and marked. this measuring plan is displayed on a monitor. The needle is visible in the image of said third plane in the form of a point which is situated within a circle around the marker because of the maneuverability of the needle. When said point is maintained on the marker during the introduction of the needle, it is ensured that the needle will continue to follow the defined path. Readjustment of the needle can be performed manually as well as automatically, for example by means of a robot. It is known to provide the needle guide section 4 with position measuring means.

A problem is encountered when the patient is subject to a change of position during this procedure, that is, a displacement and/or a change of orientation. This situation is shown in FIG. 2. In a first position of the head the path is determined again by the line through P and Q, the marker in the plane to be imaged being represented by M. If no steps are taken, in a second position of the head the marker M remains in the same location whereas the position of the point of entry of the needle is then situated in the point Q', so that the needle is introduced along a line through M and Q'; this could very well have disastrous consequences.

In order to solve this problem, in accordance with the invention position measuring means in the form of sensors 5 are provided on non-soft parts of the body of the patient per se and/or on the housing 3. The drawing shows two of such sensors 5 that are fitted on the housing 3. However, three sensors will be required so as to determine the position of the head, that is, unless the number of degrees of freedom of movement of the head is limited. Each of said sensors in the present embodiment is formed by a coil (microcoil) which is capable of measuring the local magnetic field. A change of location can be determined on the basis of the variation of the strength of the local magnetic field. To this end, the signals output by the sensors 5 are applied to the computer system 6 of the magnetic resonance apparatus. When changes have occurred in the position of the head, such changes of position are determined in the computer system by means of the signals output by the sensors, and the changes to be made in the gradient field of the gradient coils are calculated therefrom so as to output signals that readjust the local magnetic field accordingly. Consequently, the same magnetic field which prevailed in the points P and Q is then applied to the points P' and Q', so that images are acquired in imaging planes through P' and Q' instead of images in the imaging planes through P and Q, that is, through the corrected position of the tumor and the point of entry. Evidently, the position of the measuring plane should also be readjusted, so that the marker is situated at the area of M'. The needle can then be introduced along the line through P' and Q'. The needle is then readjusted on the basis of the marker M'. This means that the needle is readjusted in a co-ordinate system that is linked to the head of the patient instead in a co-ordinate system that is linked to the magnetic resonance apparatus.

The invention is not limited to the embodiment described with reference to the Figures, but also relates to a variety of modifications, of course, in as far as they are within the scope of the following claims. For example, instead of the coils, light-emitting elements such as LEDs which co-operate with a camera can be fitted on the head of the patient and/or on the housing 3. Furthermore, the position measuring means can also be formed by a video camera which is arranged at a distance from the head and whereto image identification and analysis means are coupled, or by lasers which are to be arranged at a distance from the head and by laser signal processing means which are coupled thereto. The use of the method and the magnetic resonance apparatus in accordance with the invention, of course, is not restricted to the treatment of brain tumors: they are suitable for the treatment of a variety of organs of the body, for example the liver; it is to be noted in this respect that, whereas the head can still be clamped, such clamping is difficult in the case of other organs, so that the use of a co-ordinate system defined relative to a patient is particularly advantageous.

What is claimed is:

1. A method of acquiring magnetic resonance images of a plane comprising the step of:

acquiring magnetic resonance images in imaging planes which are defined directly relative to reference points of a patient who is disposed in a magnetic resonance apparatus, said imaging planes being adjusted without utilizing a coordinate system of the magnetic resonance apparatus response to patent movement.

2. A method as claimed in claim 1, wherein position measuring means are used to define and update a position of a relevant part of the body of a patient on a real-time basis, said position enabling the imaging planes to be repeatedly defined.

3. A method of introducing a medical instrument into a nor-immobilized body of a patient positioned in a magnetic resonance apparatus where a position of a tissue to be treated has been determined in three dimensions and also a position of entry for the medical instrument has been determined, in which a path to be followed by the medical instrument is defined by at least two different images of body cross-sections through said positions in the magnetic resonance apparatus, said medical instrument being guided along said path so as to reach the tissue to. be treated, an imaging plane being defined by means of a further image in the magnetic resonance apparatus and the point of intersection of the path to be followed by the medical instrument and said imaging plane being indicated in said further image, the medical instrument being maintained at said point of intersection, viewed in the imaging plane, during its introduction, wherein the images in the magnetic resonance apparatus; are formed in imaging planes which are defined directly relative to reference points of the non-immobilized body of the patient arranged in the magnetic resonance apparatus said imaging planes being adjusted without utilizing a coordinate system of the magnetic resonance apparatus in response to patient movement.

4. A magnetic resonance apparatus comprising:

gradient coils, position measuring means for defining and updating a position of a part of the body of a patient disposed in the magnetic resonance apparatus on a real-time basis, and control means for controlling in response to signals from said position measuring means, the gradient coils in such a manner that successively acquired images in the magnetic resonance apparatus are formed in imaging planes that are defined directly relative to referance points of the patient without utilizing a coordinate system of the magnetic resonance apparatus.

5. A magnetic resonance apparatus as claimed in claim 4, wherein the position measuring means comprise sensors for attachment to a relevant part of the body of the patient.

6. A magnetic resonance apparatus as claimed in claim 5, wherein the sensors comprise coils for measuring strength of a magnetic field at the area of the coils and by means for making corrections in a gradient field of the gradient coils associated with the magnetic resonance apparatus, said corrections being based, on the variations of the strength of the magnetic field that are caused by changes in the position of the coils.

7. A magnetic resonance apparatus as claimed in claim 5, wherein the sensors comprise light-emitting elements adapted to, be attached to the patient and a camera co-operating therewith.

8. A magnetic resonance apparatus as claimed in claim 4, wherein the magnetic resonance apparatus is arranged to position a needle holder winch is associated with a needle guide member, the position measuring means being formed by sensors fitted on the needle holder which is attachable to a relevant part of the body of the patient so as to be centered relative to an entry position for the needle.

9. A magnetic resonance apparatus as claimed in claim 4, wherein the position measuring means comprise a video camera disposed at a distance from a relevant part of the body of the patient arid image identification and analysis means which are coupled thereto.

10. A magnetic resonance apparatus as claimed in claim 4, wherein the position measuring means comprise lasers arranged at a distance from a relevant part of the body of the patient and laser signal processing means coupled thereto.

* * * * *